United States Patent
Ramdani et al.

(10) Patent No.: US 6,583,034 B2
(45) Date of Patent: Jun. 24, 2003

(54) SEMICONDUCTOR STRUCTURE INCLUDING A COMPLIANT SUBSTRATE HAVING A GRADED MONOCRYSTALLINE LAYER AND METHODS FOR FABRICATING THE STRUCTURE AND SEMICONDUCTOR DEVICES INCLUDING THE STRUCTURE

(75) Inventors: Jamal Ramdani, Chandler, AZ (US); Lyndee L. Hilt, Chandler, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/740,219

(22) Filed: Dec. 18, 2000

(65) Prior Publication Data

US 2002/0060317 A1 May 23, 2002

Related U.S. Application Data

(63) Continuation-in-part of application No. 09/721,566, filed on Nov. 22, 2000.

(51) Int. Cl.$^7$ ............................................... H01L 21/20
(52) U.S. Cl. ........................ 438/507; 117/89; 148/33.4; 29/25.01
(58) Field of Search ............................ 117/89; 148/33; 29/25.01; 438/507

(56) References Cited

U.S. PATENT DOCUMENTS

| | | |
|---|---|---|
| 3,802,967 A | 4/1974 | Ladany et al. |
| 3,914,137 A | 10/1975 | Huffman et al. |
| 4,174,422 A | 11/1979 | Matthews et al. |
| 4,404,265 A | 9/1983 | Manasevit |
| 4,482,906 A | 11/1984 | Hovel et al. |
| 4,523,211 A | 6/1985 | Morimoto et al. |
| 4,661,176 A | 4/1987 | Manasevit |
| 4,793,872 A | 12/1988 | Meunier et al. |
| 4,846,926 A | 7/1989 | Kay et al. |

(List continued on next page.)

FOREIGN PATENT DOCUMENTS

| | | |
|---|---|---|
| DE | 197 12 496 | 10/1997 |
| EP | 0 250 171 | 12/1987 |
| EP | 0 342 937 | 11/1989 |
| EP | 0 455 526 | 6/1991 |
| EP | 0 514 018 | 11/1992 |
| EP | 0 581 239 | 2/1994 |
| EP | 0 602 568 | 6/1994 |
| EP | 0 607 435 | 7/1994 |
| EP | 0 682 266 | 11/1995 |

(List continued on next page.)

OTHER PUBLICATIONS

"Optimizing GMR Spin Valves: The Outlook for Improved Properties", W. F. Englhoff et al., 1998 Int'l Non Volatile Memory Technology Conference, p. 34–37.

(List continued on next page.)

*Primary Examiner*—Olik Chaudhuri
*Assistant Examiner*—Douglas A. Wille
(74) *Attorney, Agent, or Firm*—Oblon, Spivak, McClelland, Maier & Neustadt, P.C.

(57) ABSTRACT

High quality epitaxial layers of monocrystalline materials can be grown overlying monocrystalline substrates such as large silicon wafers by forming a compliant substrate for growing the monocrystalline layers. One way to achieve the formation of a compliant substrate includes first growing an accommodating buffer layer on a silicon wafer. The accommodating buffer layer is a layer of monocrystalline oxide spaced apart from the silicon wafer by an amorphous interface layer of silicon oxide. The amorphous interface layer dissipates strain and permits the growth of a high quality monocrystalline oxide accommodating buffer layer. The accommodating buffer layer is lattice matched to both the underlying silicon wafer and the overlying monocrystalline material layer. A monocrystalline graded layer, in which the lattice constant varies with the thickness of the layer, is then formed over the accommodating buffer layer, such that a lattice constant of the top of the graded layer substantially matches the lattice constant of a subsequently grown monocrystalline film.

7 Claims, 5 Drawing Sheets

U.S. PATENT DOCUMENTS

| | | | |
|---|---|---|---|
| 4,855,249 A | 8/1989 | Akasaki et al. | |
| 4,882,300 A | 11/1989 | Inoue et al. | 437/236 |
| 4,891,091 A | 1/1990 | Shastry | |
| 4,912,087 A | 3/1990 | Aslam et al. | |
| 4,928,154 A | 5/1990 | Umeno et al. | |
| 4,963,949 A | 10/1990 | Wanlass et al. | |
| 4,999,842 A | 3/1991 | Huang et al. | 372/45 |
| 5,141,894 A | 8/1992 | Bisaro et al. | |
| 5,155,658 A | 10/1992 | Inam et al. | 361/321 |
| 5,159,413 A | 10/1992 | Calviello et al. | |
| 5,173,474 A | 12/1992 | Connell et al. | |
| 5,221,367 A | 6/1993 | Chisholm et al. | |
| 5,225,031 A | 7/1993 | McKee et al. | 156/612 |
| 5,248,564 A | 9/1993 | Ramesh | 428/688 |
| 5,270,298 A | 12/1993 | Ramesh | 505/1 |
| 5,310,707 A | 5/1994 | Oishi et al. | 501/126 |
| 5,326,721 A | 7/1994 | Summerfelt | 437/131 |
| 5,358,925 A | 10/1994 | Neville Connell et al. | |
| 5,393,352 A | 2/1995 | Summerfelt | |
| 5,418,216 A | 5/1995 | Fork | |
| 5,418,389 A | 5/1995 | Watanabe | 257/295 |
| 5,450,812 A | 9/1995 | McKee et al. | |
| 5,478,653 A | 12/1995 | Guenzer | |
| 5,482,003 A | 1/1996 | McKee et al. | |
| 5,514,484 A | 5/1996 | Nashimoto | |
| 5,556,463 A * | 9/1996 | Guenzer | 117/90 |
| 5,588,995 A | 12/1996 | Sheldon | |
| 5,602,418 A * | 2/1997 | Imai et al. | 257/627 |
| 5,670,798 A | 9/1997 | Schetzina | |
| 5,674,366 A | 10/1997 | Hayashi et al. | 204/298.09 |
| 5,731,220 A | 3/1998 | Tsu et al. | 437/60 |
| 5,733,641 A | 3/1998 | Fork et al. | |
| 5,735,949 A | 4/1998 | Mantl et al. | |
| 5,741,724 A | 4/1998 | Ramdani et al. | |
| 5,801,105 A | 9/1998 | Yano et al. | 438/785 |
| 5,810,923 A | 9/1998 | Yano et al. | |
| 5,825,055 A * | 10/1998 | Summerfelt | 257/183 |
| 5,828,080 A | 10/1998 | Yano et al. | 257/43 |
| 5,830,270 A | 11/1998 | McKee et al. | |
| 5,874,860 A | 2/1999 | Brunel et al. | 330/285 |
| 5,912,068 A | 6/1999 | Jia | |
| 6,002,375 A | 12/1999 | Corman et al. | 343/853 |
| 6,020,222 A | 2/2000 | Wollesen | |
| 6,045,626 A | 4/2000 | Yano et al. | |
| 6,055,179 A | 4/2000 | Koganei et al. | 365/158 |
| 6,064,078 A | 5/2000 | Northrup et al. | |
| 6,064,092 A | 5/2000 | Park | |
| 6,078,717 A * | 6/2000 | Nashimoto et al. | 385/130 |
| 6,096,584 A | 8/2000 | Ellis-Monaghan et al. | |
| 6,100,578 A | 8/2000 | Suzuki | |
| 6,103,008 A | 8/2000 | McKee et al. | 117/2 |
| 6,107,653 A | 8/2000 | Fitzgerald | |
| 6,113,690 A | 9/2000 | Yu et al. | |
| 6,136,666 A | 10/2000 | So | |
| 6,143,072 A | 11/2000 | McKee et al. | |
| 6,174,755 B1 | 1/2001 | Manning | |
| 6,180,486 B1 | 1/2001 | Leobandung et al. | |
| 6,313,486 B1 * | 11/2001 | Kencke et al. | 257/192 |

FOREIGN PATENT DOCUMENTS

| | | | |
|---|---|---|---|
| EP | 0 999 600 | 5/2000 | |
| EP | 1 001 468 | 5/2000 | |
| GB | 1 319 311 | 6/1970 | |
| JP | 52-88354 | 7/1977 | |
| JP | 54-134554 | 10/1979 | |
| JP | 55-87424 | 7/1980 | |
| JP | 58-213412 | 12/1983 | |
| JP | 61-108187 | 5/1986 | |
| JP | 63-34994 | 2/1988 | |
| JP | 63-131104 | 6/1988 | |
| JP | 63-198365 | 8/1988 | |
| JP | HEI 2-391 | 1/1990 | |
| JP | 5-48072 | 2/1993 | |
| JP | 5-291299 | 11/1993 | |
| JP | 6-232126 | 8/1994 | |
| JP | 6-291299 | 10/1994 | |
| JP | 6-33 4168 | 12/1994 | |
| JP | 10-256154 | 9/1998 | |
| JP | 11-238683 | 8/1999 | |
| JP | 11-260835 | 9/1999 | |
| WO | WO 99/14804 | 3/1999 | |
| WO | 9914804 | 3/1999 | H01L/21/258 |
| WO | WO 99/63580 | 12/1999 | |
| WO | WO 01/04943 | 1/2001 | |
| WO | WO 02/09160 | 1/2002 | |
| WO | WO 02/47127 | 6/2002 | |

OTHER PUBLICATIONS

"Processing and Performance of Piezoelectric Films", Y. Wang et al., Univ. of MD, Wilcoxon Research Co., and Motorola Labs.

"Nonlinear acoustoelectric interactions in GaAs/LiNbO$_3$ structures", M. Rotter et al., 1999 American Institute of Physics, pp. 965–967.

"Surface acoustic wave propagation on lead zirconate titanate thin films", K. Sreenivas et al., App. Phys. Lett. 52(9), Feb. 29, 1988, pp. 709–711.

"Single Chip fused hybrids for acousto–electric and acous-to–optic applications", M. Rotter et al., 1997 American Institute of Physics, pp. 2097–2099.

"Surface Acoustic Wave Propagation in PZT/YBCO/SrTiO$_3$ and PbTi O$_3$/YBCO/SrTiO$_3$ Epitaxial Heterostructures", Dept. of Physics & Astrophysics, Univ. of Delhi, pp. 275–283.

"Ferroelectric Field Effect Transisitor Based on Epitaxial Perovskite Heterostructures", S. Mathews et al., American Association for the Advancement of Science, 1997, pp. 238–240.

"Formation of Si Epi./MgO—Al$_2$O$_3$ Epi./SiO$_3$/Si and Its Epitaxial Film Quality," Masao Mikami et al., Fundamental Research Laboratories and Microelectronics Laboratories, pp. 31–34.

"An Epitaxial Si/Insulator/Si Structure Prepared by Vacuum Deposition of CaF$_2$ and Silicon," T. Asano et al., Graduate School of Science and Engineering, Tokyo Institute of Technology, pp. 143–151.

"Reaction and Regrowth Control of CeO$_2$ on Si(111) Surface for the Silicon–On–Insulator Structure," T. Chikyow et al., Appl. Phys. Lett. 65(8), Aug. 22, 1994, pp. 1030–1032.

"Epitaxial Growth of CeO$_2$(100) Films on Si(100) Substrates by Dual Ion Beams Reactive Sputtering," J.F. Kang et al., Solid State Communications, vol. 108, No. 4, pp. 225–227.

"Vertical–Cavity Surface–Emitting Lasers Come of Age," Robert A. Morgan et al., SPIE, vol. 2683, pp. 18–29.

"Technical Analysis of Qualcomm QCP–800 Portable Cellular Phone(Transmitter Circuitry)," Talus Corporation, Qualcomm QCP–800 Technical Analysis Report, Dec. 10, 1996, pp. 5–8.

"Properties of GaAs Si Grown by Molecular Beam Epitaxy, "R. Houdre et al., Solid State and Molecular Sciences, 1990, pp. 91–114.

"Gallium Arsenide and Other Compound Semiconductors on Silicon," S.F. Fang et al., J. Appl. Phys. 68(7), Oct. 1, 1990, pp. R31–R58.

"Integration of GaAs on Si Using a Spinel Buffer Layer", IBM Technical Bulletin, vol. 30, No. 6, Nov. 1987, p. 365.

"GaInAs Superconducting FET," IBM Technical Bulletin, vol. 36, No. 8, Aug. 1993, p. 655–656.

"Epitaxial 3d Structure Using Mixed Spinels," IBM Technical Bulletin, vol. 30, No. 3, Aug. 1987, p. 1271.

Moon et al., "Roles of Buffer Layers in Epitaxial Growth of Sr/TiO$_3$ Films on Silicon Substrates," *Japan J of Appl. Phys.*, vol. 33, Mar. 1994, pp. 1472–1477.

Yodo et al., GaAs Heteroepitaxial Growth on Si Substrates with Thin Si Interlayers in situ Annealed at High Temperatures, *8257b Journal of Vacuum Science & Technology*, May/Jun., 1995, vol. 13, No. 3, pp. 1000–1005.

Cuomo et al., "Substrate Effect on the Superconductivity of YBa$_2$Cu$_3$O$_7$ Thin Films," AIP Conference 1988, pp. 141–148.

McKee et al., "Crystalline Oxides on Silicon: The First Five Monolayers," *Physical Review Letters*, vol. 81, No. 14, Oct., 1998, pp. 3014–3017.

McKee et al., "Molecular Beam Epitaxy Growth of Epitaxial Barium Silicide, Barium Oxide, and Barium Titanate on Silicon," *1991 American Institute of Physics*, pp. 782–784, Aug. 13, 1991.

Tambo et al., Molecular Beam Epitaxy Growth of SrTiO$_3$ Films on Si(100)-2x1 with SrO Buffer Layer, *Jpn. J. Appl. Phys.*, vol. 37, 1998, pp. 4454–4459.

McKee et al., "The MBE Growth and Optical Quality of BaTiO$_3$ and SrTiO$_3$ Thin Films on MgO," *Mat. Res. Soc. Symp. Proc.*, vol. 341, Apr. 1994, pp. 309–314.

McKee et al., "BaSi$_2$ and Thin Film Alkaline Earth Silicides on Silicon," *Appl. Phys. Lett.*, 63 (20), Nov. 1993, pp. 2818–2820.

McKee et al., "Surface Structures and the Orthorhombic Transformation of Thin Film BaSi$_2$ on Silicon,"*Mat. Res. Soc. Symp. Proc.*, vol. 221, pp. 131–136.

Mori et al., "Epitaxial Growth of SrTiO$_3$ Films on Si(100) Substrates Using a Focused Electron Beam Evaporation Method," *Jpn. J. of Apl. Phys.*, vol. 30, No. 8A, Aug. 1991, pp. L1415–L1417.

Moon et al., "Growth of Crystalline SrTiO$_3$ Films on Si Substrates Using Thin Fluoride Buffer Layers and Their Electrical Properties," *Jpn. J. of Appl. Phys.*, vol. 33, (1994), pp. 5911–5916.

Farrow et al., "Heteroepitaxy of Dissimilar Materials," *Mat. Res. Soc. Symposium Proceedings*, vol. 221, pp. 29–34, Apr. 29–May 2, 1991.

Choi et al., "Heteroepitaxy on Silicon: Fundamentals, Structure, and Devices," *Mat. Res. Soc.*, Symposium Proceedings, vol. 116, pp. 369–374, Apr. 5–8, 1988.

H. Nagata, "A Preliminary Consideration of the Growth Behaviour of CeO$_2$, SrTiO$_3$ and SrVO$_3$ Films on Si Substrate," *Thin Solid Films*, 224, 1993, pp. 1–3.

Nagata et al., "Heteroepitaxial Growth of CeO$_2$(001) Films on Si(001) Substrates by Pulsed Laser Deposition in Ultrahigh Vacuum," *Jpn. Jour. Appl. Phys.*, vol. 30, No. 6B, Jun. 1991, pp. L1136–L1138.

Bean et al., "Silicon Molecular Beam Epitaxy," *Materials Research Symposium Proceedings*, vol. 220, pp. 595–600, Apr. 29–May 3, 1991.

Nakagawara et al., Effects of Buffer Layers in Epitaxial Growth of SrTiO$_3$ Thin Film on Si(100), *J. Appl. Phys.*, 78 (12), Dec. 15, 1995, pp. 7226–7230.

Suzuki et al., "A Proposal of Epitaxial Oxide Thin Film Structures For Future Oxide Electronics," *Materials Science and Engineering B41*, (1996), pp. 166–173.

W. F. Egelhoff et al., "Optimizing GMR Spin Valves: The Outlook for Improved Properties", *1998 Int'l Non Volatile Memory Technology Conference*, pp. 34–37.

Wang et al., "Processing and Performance of Piezoelectric Films", Univ. Of MD, Wilcoxon Research Col, and Motorola Labs, May 11, 2000.

M. Rotter et al., "Nonlinear Acoustoelectric Interactions in GaAs/LiNbO$_3$ Structures", *Applied Physics Letters*, vol. 75(7), Aug. 16, 1999, pp. 965–967.

K. Sreenivas et al., "Surface Acoustic Wave Propagation on Lead Zirconate Titanate Thin Films," *Appl. Phys. Lett.* 52 (9), Feb. 29, 1998, pp. 709–711.

M. Rotter et al., "Single Chip Fused Hybrids for Acousto–Electric and Acousto–Optic Applications," *1997 Applied Physics Letters*, vol. 70(16), Apr. 21, 1997, pp. 2097–2099.

A. Mansingh et al., "Surface Acoustic Wave Propagation in PZT/YBCO/SrTiO$_3$ Epitaxial Heterostructures," *Ferroelectric*, vol. 224, pp. 275–282, 1999.

S. Mathews et al., "Ferroelectric Field Effect Transisitor Based on Epitaxial Perovskite Heterostructures", Science, vol. 276, Apr. 11, 1997, pp. 238–240.

R. Houdre et al., "Properties of GaAs on Si Grown by Molecular Beam Epitaxy," *Solid State and Materials Sciences*, vol. 16, Issue 2, 1990, pp. 91–114.

S. F. Fang et al., "Gallium Arsenide and Other Compound Semiconductors on Silicon," *J. Appl. Phys.*, 66(7), Oct. 1, 1990, pp. R31–R58.

Carlin et al., Impact of GaAs Buffer Thickness on Electronic Quality of GaAs Grown on Graded Ge/GeSi/Si Substrates, *Appl. Phys. Letter*, vol. 76, No. 14, Apr. 2000, pp. 1884–1886.

Ringel et al., "Epitaxial Integration of III–V Materials and Devices with Si Using Graded GeSi Buffers," 27th International Symposium on Compound Semiconductors, Oct. 2000.

Zogg et al., "Progress in Compound–Semiconductor–on––Silicon–Heteroepitaxy with Fluoride Buffer Layers," *J. Electrochem Soc.*, vol. 136, No. 3, Mar. 1998, pp. 775–779.

Xiong et al., "Oxide Defined GaAs Vertical–Cavity Surface–Emitting Lasers on Si Substrates," *IEEE Photonics Technology Letters*, vol. 12, No. 2, Feb. 2000, pp. 110–112.

Clem et al., "Investigation of PZT//LSCO//Pt//Aerogel Thin Film Composites for Uncooled Pyroelectric IR Detectors," *Mat. Res. Soc. Symp. Proc.*, vol. 541, pp. 661–666, 1999.

Gunapala et al., "Bound–To–Quasi–Bound Quantum–Well Infrared Photodetectors," NASA Tech Brief, vol. 22, No. 9, Sep. 1998.

Bruley et al., "Nanostructure and Chemistry of (100)MgO/(100) GaAs Interface," *Appl. Phys. Lett.*, 65(5), Aug. 1994, pp. 564–566.

Fork et al., "Epitaxial MgO On Si(001) for Y—Ba—Cu—O Thin Film Growth by Pulsed Laser Deposition," *Appl. Phys. Lett.*, 58(20), May 20, 1991, pp. 2294–2296.

Himpsel et al., "Dialectrics on Semiconductors," *Materials Science and Engineering*, B1(1988), pp. 9–13.

Li et al., "Epitaxial La$_{0.67}$Sr$_{0.33}$MnO$_3$ Magnetic Tunnel Junctions," *J. Appl. Phys.* 81(8), Apr. 15, 1997, pp. 5509–5511.

O'Donnell et al., "Colossal Magnetoresistance Magnetic Tunnel Junctions Grown by Molecular–Beam Epitaxy," *Appl. Physics Letters,* vol. 76, No. 14, Apr. 3, 2000, pp. 1914–1916.

Mikami et al., "Formation of Si Epi/MgO—$Al_2O_3$Epi./$SiO_3$/Si and Its Epitaxial Film Quality," Fundamental Research Laboratories and Microelectronics Laboratories, pp. 31–34, 1983.

T. Asano et al., "An Epitaxial Si/Insulator/Si Structure Prepared by Vacuum Deposition of $CaF_2$ and Silicon," *Thin Solid Films,* vol. 93 (1982), pp. 143–150.

T. Chikyow et al., "Reaction and Regrowth Control of $CeO_2$ on Si(111) Surface for the Silicon–On–Insulator Structure," *Appl. Phys. Lett.,* vol. 65, No. 8, Aug. 22, 1994, pp. 1030–1032.

J.F. Kang, et al., "Epitaxial Growth of $CeO_2$(100) Films on Si(100) Substrates by Dual Ion Beams Reactive Sputtering," *Solid State Communications,* vol. 108, No. 4, pp. 225–227, 1998.

R. A. Morgan et al., "Vertical–Cavity Surface–Emitting Lasers Come of Age," *SPIE,* vol. 2683, pp. 18–29.

"Technical Analysis of Qualcomm QCP–800 Portable Cellular Phone (Transmitter Circuitry)," Talus Corporation, Qualcomm QCP–800 Technical Analysis Report, Dec. 10, 1996, pp. 5–8.

\* cited by examiner

SEMICONDUCTOR STRUCTURE INCLUDING A COMPLIANT SUBSTRATE HAVING A GRADED MONOCRYSTALLINE LAYER AND METHODS FOR FABRICATING THE STRUCTURE AND SEMICONDUCTOR DEVICES INCLUDING THE STRUCTURE

CROSS REFERENCE TO RELATED APPLICATIONS

This application is a continuation-in-part of U.S. patent application Ser. No. 09/721,566, filed Nov. 22, 2000, by the assignee hereof.

FIELD OF THE INVENTION

This invention relates generally to semiconductor structures and devices and to a method for their fabrication, and more specifically to semiconductor structures and devices and to the fabrication and use of semiconductor structures, devices, and integrated circuits that include a substrate having a graded monocrystalline layer to facilitate growth of monocrystalline material on the substrate.

BACKGROUND OF THE INVENTION

Semiconductor devices often include multiple layers of conductive, insulating, and semiconductive layers. Often, the desirable properties of such layers improve with the crystallinity of the layer. For example, the electron mobility and band gap of semiconductive layers improves as the crystallinity of the layer increases. Similarly, the free electron concentration of conductive layers and the electron charge displacement and electron energy recoverability of insulative or dielectric films improves as the crystallinity of these layers increases.

For many years, attempts have been made to grow various monocrystalline thin films on a foreign substrate such as silicon (Si). To achieve optimal characteristics of the various monocrystalline layers, however, a monocrystalline film of high crystalline quality is desired. Attempts have been made, for example, to grow various monocrystalline layers on a substrate such as germanium, silicon, and various insulators. These attempts have generally been unsuccessful because lattice mismatches between the host crystal and the grown crystal have caused the resulting layer of monocrystalline material to be of low crystalline quality.

If a large area thin film of high quality monocrystalline material was available at low cost, a variety of semiconductor devices could advantageously be fabricated in or using that film at a low cost compared to the cost of fabricating such devices beginning with a bulk wafer of the monocrystalline material. In addition, if a thin film of high quality monocrystalline material could be realized beginning with a bulk wafer such as a silicon wafer, an integrated device structure could be achieved that took advantage of the best properties of both the silicon and the high quality monocrystalline material.

Accordingly, a need exists for a semiconductor structure that provides a high quality monocrystalline film or layer over another monocrystalline material and for a process for making such a structure. In other words, there is a need for providing the formation of a monocrystalline substrate that is compliant with a high quality monocrystalline material layer so that true two-dimensional growth can be achieved for the formation of semiconductor structures, devices and integrated circuits formed using the high-quality monocrystalline material layer grown on the compliant substrate. This grown monocrystalline material layer may be comprised of a semiconductor material, a compound semiconductor material, and other types of material such as metals.

BRIEF DESCRIPTION OF THE DRAWINGS

The present invention is illustrated by way of example and not limitation in the accompanying figures, in which like references indicate similar elements, and in which.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF THE DRAWINGS

Figure 1:
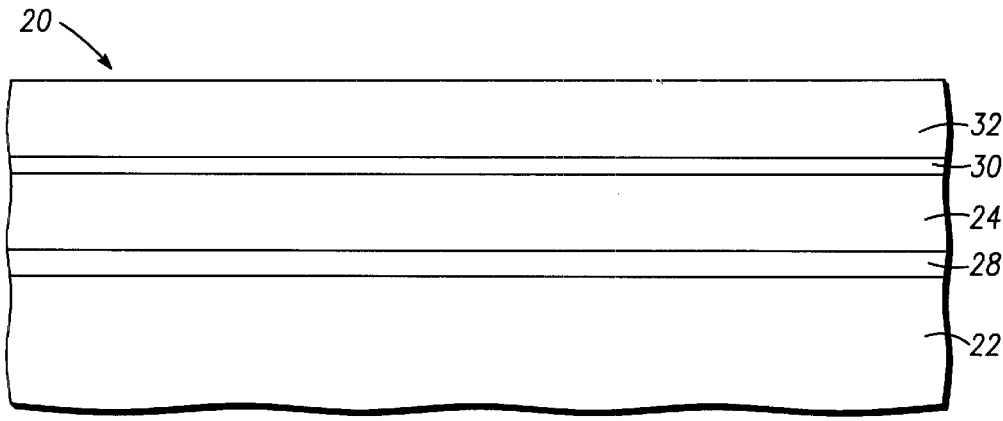
FIGS. 1, 2, and 3 illustrate schematically, in cross section, device structures in accordance with various embodiments of the invention.

FIG. 1 illustrates schematically, in cross section, a portion of a semiconductor structure 20, suitable for facilitating subsequent growth of a desired monocrystalline material, in accordance with an embodiment of the invention. Semiconductor structure 20 includes a monocrystalline substrate 22, accommodating buffer layer 24 comprising a monocrystalline material, and a monocrystalline graded layer 32. In this context, the term "monocrystalline" shall have the meaning commonly used within the semiconductor industry. The term shall refer to materials that are a single crystal or that are substantially a single crystal and shall include those materials having a relatively small number of defects such as dislocations and the like as are commonly found in substrates of silicon or germanium or mixtures of silicon and germanium and epitaxial layers of such materials commonly found in the semiconductor industry.

In accordance with one embodiment of the invention, structure 20 also includes an amorphous intermediate layer 28 positioned between substrate 22 and accommodating buffer layer 24. Structure 20 may also include a template layer 30 between the accommodating buffer layer and graded monocrystalline material layer 32. As will be explained more fully below, the template layer helps to initiate the growth of the graded monocrystalline material layer on the accommodating buffer layer. The amorphous intermediate layer helps to relieve the strain in the accommodating buffer layer and by doing so, aids in the growth of a high crystalline quality accommodating buffer layer.

Substrate 22, in accordance with an embodiment of the invention, is a monocrystalline semiconductor or compound semiconductor wafer, preferably of large diameter. The wafer can be of, for example, a material from Group IV of the periodic table, and preferably a material from Group IVB. Examples of Group IV semiconductor materials include silicon, germanium, mixed silicon and germanium, mixed silicon and carbon, mixed silicon, germanium and carbon, and the like. Preferably substrate 22 is a wafer containing silicon or germanium, and most preferably is a high quality monocrystalline silicon wafer as used in the semiconductor industry. Accommodating buffer layer 24 is preferably a monocrystalline oxide or nitride material epitaxially grown on the underlying substrate. In accordance with one embodiment of the invention, amorphous intermediate layer 28 is grown on substrate 22 at the interface between substrate 22 and the growing accommodating buffer layer by the oxidation of substrate 22 during the growth of layer 24. The amorphous intermediate layer serves to relieve strain that might otherwise occur in the monocrystalline accommodating buffer layer as a result of differences in the lattice constants of the substrate and the buffer layer. As used herein, lattice constant refers to the distance between atoms of a cell measured in the plane of the surface. If such strain is not relieved by the amorphous intermediate layer, the strain may cause defects in the crystalline structure of the accommodating buffer layer. Defects in the crystalline structure of the accommodating buffer layer, in turn, would make it difficult to achieve a high quality crystalline structure in monocrystalline material layer 26 which may comprise a semiconductor material, a compound semiconductor material, or another type of material such as a metal.

Accommodating buffer layer 24 is preferably a monocrystalline oxide or nitride material selected for its crystalline compatibility with the underlying substrate and with overlying graded layer 32. For example, the material could be an oxide or nitride having a lattice structure closely matched to the substrate and to the subsequently applied monocrystalline graded material layer. Materials that are suitable for the accommodating buffer layer include metal oxides such as the alkaline earth metal titanates, alkaline earth metal zirconates, alkaline earth metal hafnates, alkaline earth metal tantalates, alkaline earth metal ruthenates, alkaline earth metal niobates, alkaline earth metal vanadates, perovskite oxides such as alkaline earth metal tin-based perovskites, lanthanum aluminate, lanthanum scandium oxide, and gadolinium oxide.

Additionally, various nitrides such as gallium nitride, aluminum nitride, and boron nitride may also be used for the accommodating buffer layer. Most of these materials are insulators, although strontium ruthenate, for example, is a conductor. Generally, these materials are metal oxides or metal nitrides, and more particularly, these metal oxide or nitrides typically include at least two different metallic elements. In some specific applications, the metal oxides or nitrides may include three or more different metallic elements.

Amorphous interface layer 28 is preferably an oxide formed by the oxidation of the surface of substrate 22, and more preferably is composed of a silicon oxide. The thickness of layer 28 is sufficient to relieve strain attributed to mismatches between the lattice constants of substrate 22 and accommodating buffer layer 24. Typically, layer 28 has a thickness in the range of approximately 0.5–5 nim.

In general, layer 32 provides a transition in lattice constants between the lattice constant of accommodating buffer layer 24 and a subsequently deposited layer of monocrystalline material overlying graded layer 32. More particularly, the material for layer 32 is selected such that the lattice constant of layer 32 can be altered by changing the composition of layer 32, such that a bottom portion of layer 32 is lattice matched to accommodating buffer layer 24 and a top portion of layer 32 is lattice matched to the subsequently applied layer of monocrystalline material.

The material for graded monocrystalline layer 32 can be selected, as desired, for a particular structure or application. For example, the monocrystalline material of layer 32 may comprise a mixed Group IV semiconductor, where the lattice constant of the material is altered as a function of thickness of the film by varying the ratio of components in the film. In accordance with one embodiment of the invention, layer 32 comprises $Si_xGe_{1-x}$ (x ranges from 0–1) where the concentration of germanium is low (i.e. 0%) near the surface of template 30 and high (i.e. 100%) near the top of layer 32. In this case, the lower surface of layer 32 is closely lattice matched to material comprising accommodating buffer layer 24, whereas the top of layer 32 is lattice matched to germanium, which is in turn lattice matted to compound semiconductor materials such as gallium arsenide. Thus, structure 20 provides a suitable substrate for subsequent growth of monocrystalline material (such as compound semiconductor material) having a lattice constant that differs from the lattice constants of materials of either substrate 22 or accommodating buffer layer 24.

Appropriate materials for template 30 are discussed below. Suitable template materials chemically bond to the surface of the accommodating buffer layer 24 at selected sites and provide sites for the nucleation of the epitaxial growth of graded monocrystalline layer 32. When used, template layer 30 has a thickness ranging form about 1 to about 10 monolayers.

Figure 2:
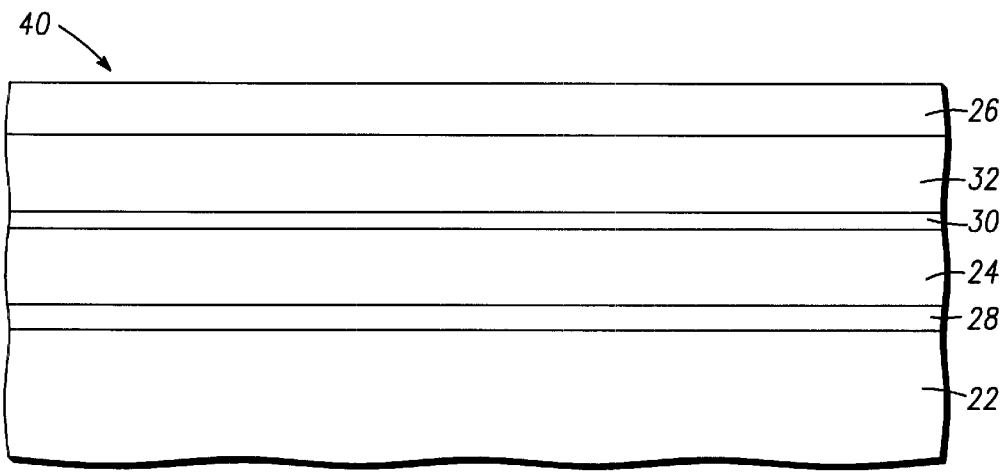

FIG. 2 illustrates, in cross section, a portion of a semiconductor structure 40 in accordance with a further embodiment of the invention. Structure 40 is similar to the previously described semiconductor structure 20, except that an additional layer of monocrystalline material 26 is formed over graded layer 32. Layer 26 material may include insulating, semiconducting, or conducting materials. For example, layer 26 may include compound semiconductor material such as III–V, mixed III–V, II–VI, mixed II–VI, and Group IV materials; conducting materials such as metals; and insulating material such as oxides.

Figure 3:
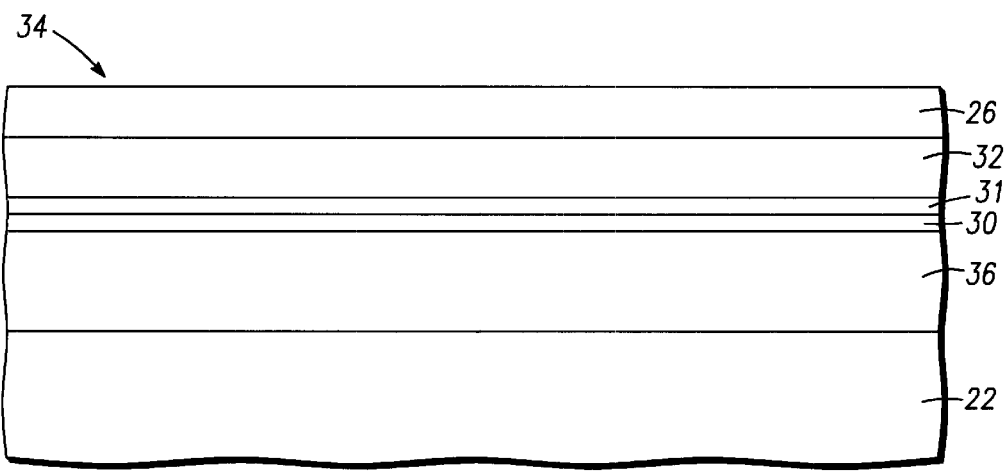

FIG. 3 schematically illustrates, in cross section, a portion of a semiconductor structure 34 in accordance with another exemplary embodiment of the invention. Structure 34 is similar to structure 40, except that structure 34 includes an amorphous layer 36, rather than accommodating buffer layer 24 and amorphous interface layer 28, and an additional cap layer 31.

As explained in greater detail below, amorphous layer 36 may be formed by first forming an accommodating buffer layer and an amorphous interface layer in a similar manner to that described above. Cap layer 31 is then formed (by epitaxial growth) overlying the monocrystalline accommodating buffer layer. The accommodating buffer layer is then exposed to a heating or anneal process to convert the monocrystalline accommodating buffer layer to an amorphous layer. Amorphous layer 36 formed in this manner comprises materials from the accommodating buffer layer, the interface layer, and cap layer 31 which layers may or may not amalgamate. Thus, layer 36 may comprise one, two, or three amorphous layers. Formation of amorphous layer 36 between substrate 22 and graded layer 32 (subsequent to layer 31 formation) relieves stresses between layers 22 and 32 and provides a true compliant substrate for subsequent processing—e.g., monocrystalline material layer 26 formation.

Furthermore, formation of amorphous layer 36 provides a "viscous" strain relief layer, which allows for monocrylstalline growth of layer 26, with a grater lattice mismatch between layers 26 and 22. Furthermore, dislocation nets, which result from deposition of material for layer 26, may be confined, as a result of forming layer 36, to a region including or proximate layers 31 and 36.

The processes previously described above in connection with FIGS. 1 and 2 are adequate for growing monocrystalline material layers over a monocrystalline substrate. However, the process described in connection with FIG. 3, which includes transforming a monocrystalline accommodating buffer layer to an amorphous layer, may be better for growing monocrystalline material layers for the reasons noted above.

Cap layer 31 may include any of the materials described throughout this application in connection with either of monocrystalline material layer 26 or graded layer 32. For example, when monocrystalline material layer 26 comprises a semiconductor or compound semiconductor material, layer 31 may include monocrystalline Group IV (e.g., Si or $Si_xGe_{1-x}$, where x ranges from 0 to 1) or monocrystalline compound semiconductor materials.

In accordance with one embodiment of the present invention, cap layer 31 serves as an anneal cap during layer 36 formation and as a template for subsequent monocrystalline layer 26 formation. Accordingly, layer 31 is preferably thick enough to provide a suitable template for layer 32 growth (at least one monolayer) and thin enough to allow layer 32 to form as a substantially defect free monocrystalline material.

In accordance with another embodiment of the invention, graded layer 32 may form an anneal cap. In this case, cap layer 31 may not be required. In other words, the graded monocrystalline layer may also serve as an anneal cap.

The following non-limiting, illustrative examples illustrate various combinations of materials useful in structures 20, 40, and 34 in accordance with various alternative embodiments of the invention. These examples are merely illustrative, and it is not intended that the invention be limited to these illustrative examples.

EXAMPLE 1

In accordance with one embodiment of the invention, monocrystalline substrate 22 is a silicon substrate oriented in the (100) direction. The silicon substrate can be, for example, a silicon substrate as is commonly used in making complementary metal oxide semiconductor (CMOS) integrated circuits having a diameter of about 200–300 mm. In accordance with this embodiment of the invention, accommodating buffer layer 24 is a monocrystalline layer of $Sr_zBa_{1-z}TiO_3$ where z ranges from 0 to 1 and the amorphous intermediate layer is a layer of silicon oxide ($SiO_x$) formed at the interface between the silicon substrate and the accommodating buffer layer. The value of z is selected to obtain one or more lattice constants closely matched to corresponding lattice constants of the subsequently formed layer 32. The accommodating buffer layer can have a thickness of about 2 to about 100 nanometers (nm) and preferably has a thickness of about 5 nm. In general, it is desired to have an accommodating buffer layer thick enough to isolate the graded layer from the substrate. Layers thicker than 100 nm usually provide little additional benefit while increasing cost unnecessarily; however, thicker layers may be fabricated if needed. The amorphous intermediate layer of silicon oxide can have a thickness of about 0.5–5 nm, and preferably a thickness of about 1 to 2 nm.

In accordance with this embodiment of the invention, nionocrystalline layer 32 is a Group IV semiconductor layer comprising $Si_yGe_{1-y}$, where y ranges from 0 to 1 having a thickness of about 1 nm to about 100 μm, preferably a thickness of about 0.1 μm to 10 μm, and more preferably about 0.1 to 5 μm. The thickness generally depends on the subsequently deposited material (e.g., layer 26 of FIGS. 2–3). The compositions of other compound semiconductor materials, such as those listed above, may also be similarly varied to manipulate the lattice constant of layer 32 in a like manner. To facilitate the epitaxial growth of the graded layer on the monocrystalline oxide, a template layer is formed by capping the oxide layer. The template layer is preferably 1–10 monolayers of Ti—As, Sr—O—As, Sr—Ga—O, or Sr—Al—O.

EXAMPLE 2

In accordance with a further embodiment of the invention, monocrystalline substrate 22 is a silicon substrate as described above. The accommodating buffer layer is a monocrystalline oxide of strontium or barium zirconate or haffate in a cubic or orthorhombic phase with an amorphous intermediate layer of silicon oxide formed at the interface between the silicon substrate and the accommodating buffer layer. The accommodating buffer layer can have a thickness of about 2–100 nm and preferably has a thickness of at least 5 nm to ensure adequate crystalline and surface quality and is formed of a monocrystalline $SrZrO_3$, $BaZrO_3$, $SrHfO_3$, $BaSnO_3$ or $BaHfO_3$. For example, a monocrystalline oxide layer of $BaZrO_3$ can grow at a temperature of about 700° C. The lattice structure of the resulting crystalline oxide exhibits a 45 degree rotation with respect to the substrate silicon lattice structure.

An accommodating buffer layer formed of these zirconate or hafnate materials is suitable for the growth of a monocrystalline material layer which comprises compound semiconductor materials in the indium phosphide (InP) system. In this system, the graded layer material can be, for example, indium phosphide (InP), indium gallium arsenide (InGaAs), aluminum indium arsenide, (AlInAs), or aluminum gallium indium arsenic phosphide (AlGaInAsP), having a thickness of about 1.0 nm to 10 Mm. A suitable template for this structure is 1–10 monolayers of zirconium-arsenic (Zr—As), zirconium-phosphorus (Zr—P), hafnium-arsenic (Hf—As), hafnium-phosphorus (Hf—P), strontium-oxygen-arsenic (Sr—O—As), strontium-oxygen-phosphorus (Sr—O—P), barium-oxygen-arsenic (Ba—O—As), indium-strontium-oxygen (In—Sr—O), or barium-oxygen-phosphorus (Ba—O—P), and preferably 1–2 monolayers of one of these materials. By way of an example, for a barium zirconate accommodating buffer layer, the surface is terminated with 1–2 monolayers of zirconium followed by deposition of 1–2 monolayers of arsenic to form a Zr—As template. A monocrystalline layer of the graded layer material from the indium phosphide system is then grown on the template layer. The resulting lattice structure of the compound semiconductor material exhibits a 45 degree rotation with respect to the accommodating buffer layer lattice structure and a lattice mismatch to (100) InP of less than 2.5%, and preferably less than about 1.0%.

EXAMPLE 3

In accordance with a further embodiment of the invention, a structure is provided that is suitable for the growth of an epitaxial film of a monocrystalline material comprising a II–VI material overlying a silicon substrate. The substrate is preferably a silicon wafer as described above. A suitable accommodating buffer layer material is $Sr_xBa_{1-x}TiO_3$, where x ranges from 0 to 1, having a thickness of about 2–100 nm and preferably a thickness of about 5–15 nm. Where the graded monocrystalline layer comprises a compound semiconductor material, the II–VI compound semiconductor material can be, for example, zinc selenide (ZnSe) or zinc sulfur selenide (ZnSSe). A suitable template for this material system includes 1–10 monolayers of zinc-oxygen (Zn—O) followed by 1–2 monolayers of an excess of zinc followed by the selenidation of zinc on the surface. Alternatively, a template can be, for example, 1–10 monolayers of strontium-sulfur (Sr—S) followed by the ZnSeS.

EXAMPLE 4

This embodiment of the invention is an example of structure 40 illustrated in FIG. 2. Substrate 22, accommodating buffer layer 24, and graded monocrystalline layer 32 can be similar to those described in example 1. Structure 40 also includes an additional monocrystalline layer 26, e.g., GaAs. In this case, a suitable template for layer 26 formation may be germanium, which forms the top portion of graded layer 32.

EXAMPLE 5

This example also illustrates materials useful in a structure 40 as illustrated in FIG. 2. Substrate material 22, accommodating buffer layer 24, monocrystalline graded layer 32 and template layer 30 can be the same as those described above in example 2. In accordance with one aspect of this embodiment, graded layer 32 includes InGaAs, in which the indium composition varies from 0 to about 50%. The buffer layer preferably has a thickness of about 10–30 nm. Varying the composition of the graded layer from GaAs to InGaAs serves to provide a lattice match between the underlying monocrystalline oxide material and the overlying layer of monocrystalline material which in this example is a compound semiconductor material.

EXAMPLE 6

This example provides exemplary materials useful in structure 34, as illustrated in FIG. 3. Substrate material 22, template layer 30, and monocrystalline material layer 26 may be the same as those described above in connection with example 4.

Amorphous layer 36 is an amorphous layer which is suitably formed of a combination of amorphous intermediate layer materials (e.g., layer 28 materials as described above) and accommodating buffer layer materials (e.g., layer 24 materials as described above) and may include layer 31 materials. For example, amorphous layer 36 may include a combination of $SiO_x$, $Sr_zBa_{1-z}TiO_3$ (where z ranges from 0 to 1), and Si which combine or mix, at least partially, during an anneal process to form amorphous layer 36.

The thickness of amorphous layer 36 may vary from application to application and may depend on such factors as desired insulating properties of layer 36, type of monocrystalline material comprising layer 26, and the like. In accordance with one exemplary aspect of the present embodiment, layer 36 thickness is about 2 nm to about 100 nm, preferably about 2–10 nm, and more preferably about 5–6 nm.

Layer 31 comprises a monocrystalline material that can be grown epitaxially over a monocrystalline material such as material used to form accommodating buffer layer 24. In accordance with one embodiment of the invention, layer 31 includes the same materials as those comprising layer 32. For example, if layer 32 includes SiGe, layer 31 also includes SiGe. However, in accordance with other embodiments of the present invention, layer 31 includes materials different from those used to form layer 32. In accordance with one exemplary embodiment of the invention, layer 31 comprises silicon and is about 1 monolayer to about 100 nm thick.

Referring again to FIGS. 1–3, substrate 22 is a monocrystalline substrate such as a monocrystalline silicon or gallium arsenide substrate. The crystalline structure of the monocrystalline substrate is characterized by a lattice constant and by a lattice orientation. In similar manner, accommodating buffer layer 24 is also a monocrystalline material and the lattice of that monocrystalline material is characterized by a lattice constant and a crystal orientation. The lattice constants of the accommodating buffer layer and the monocrystalline substrate must be closely matched or, alternatively, must be such that upon rotation of one crystal orientation with respect to the other crystal orientation, a substantial match in lattice constants is achieved. In this context the terms "substantially equal" and "substantially matched" mean that there is sufficient similarity between the lattice constants to permit the growth of a high quality crystalline layer on the underlying layer.

Figure 4:
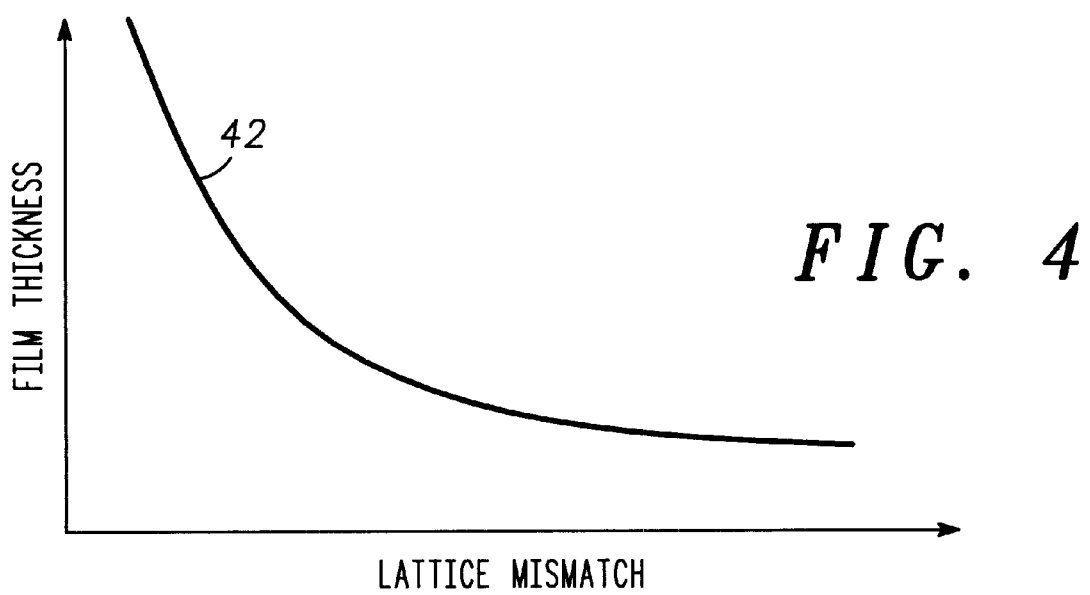
FIG. 4 illustrates graphically the relationship between maximum attainable film thickness and lattice mismatch between a host crystal and a grown crystalline overlayer.

FIG. 4 illustrates graphically the relationship of the achievable thickness of a grown crystal layer of high crystalline quality as a function of the mismatch between the lattice constants of the host crystal and the grown crystal. Curve 42 illustrates the boundary of high crystalline quality material. The area to the right of curve 42 represents layers that have a large number of defects. With no lattice mismatch, it is theoretically possible to grow an infinitely thick, high quality epitaxial layer on the host crystal. As the mismatch in lattice constants increases, the thickness of achievable, high quality crystalline layer decreases rapidly. As a reference point, for example, if the lattice constants between the host crystal and the grown layer are mismatched by more than about 2%, monocrystalline epitaxial layers in excess of about 20 nm cannot be achieved.

In accordance with one embodiment of the invention, substrate 22 is a (100) or (111) oriented monocrystalline silicon wafer and accommodating buffer layer 24 is a layer of strontium barium titanate. Substantial matching of lattice constants between these two materials is achieved by rotating the crystal orientation of the titanate material by 45° with respect to the crystal orientation of the silicon substrate wafer. The inclusion in the structure of amorphous interface layer 28, a silicon oxide layer in this example, if it is of sufficient thickness, serves to reduce strain in the titanate monocrystalline layer that might result from any mismatch in the lattice constants of the host silicon wafer and the grown titanate layer. As a result, in accordance with an embodiment of the invention, a high quality, thick, monocrystalline titanate layer is achievable.

Referring to FIGS. 2–3, layer 26 is a layer of epitaxially grown monocrystalline material and that crystalline material is also characterized by a crystal lattice constant and a crystal orientation. In accordance with one embodiment of the invention, the lattice constant of layer 26 differs from the lattice constant of substrate 22. To achieve high crystalline quality in this epitaxially grown graded monocrystalline layer 32, the accommodating buffer layer must be of high crystalline quality. In addition, in order to achieve high crystalline quality in layer 26, substantial matching between the crystal lattice constant of the host crystal, in this case, the monocrystalline graded layer, and the grown crystal is desired. With properly selected materials this substantial matching of lattice constants is achieved as a result of changing the lattice constant of layer 32 by varying the composition of layer 32. For example, if the grown crystal is gallium arsenide, aluminum gallium arsenide, zinc selenide, or zinc sulfur selenide and the accommodating buffer layer is monocrystalline $Sr_xBa_{1-x}TiO_3$, substantial matching of crystal lattice constants of the two materials is achieved by varying a composition of a $Si_xGe_{1-x}$ layer 32 from silicon to germanium. Crystalline layer 32 between the oxide and the grown monocrystalline material layer reduces strain in the grown monocrystalline material layer that might result from small differences in lattice constants. Better crystalline quality in the grown monocrystalline material layer can thereby be achieved. Furthermore, layer 32 facilitates confinement of crystal defects at or near the interface of layers 32 and 36 and away from layer 26.

The following example illustrates a process, in accordance with one embodiment of the invention, for fabricating a semiconductor structure such as the structures depicted in FIGS. 1–3. The process starts by providing a monocrystalline semiconductor substrate comprising silicon or germanium. In accordance with a preferred embodiment of the invention, the semiconductor substrate is a silicon wafer having a (100) orientation. The substrate is preferably oriented on axis or, at most, about five degrees off axis. At least a portion of the semiconductor substrate has a bare surface, although other portions of the substrate, as described below, may encompass other structures. The term "bare" in this context means that the surface in the portion of the substrate has been cleaned to remove any oxides, contaminants, or other foreign material. As is well known, bare silicon is highly reactive and readily forms a native oxide. The term "bare" is intended to encompass such a native oxide. A thin silicon oxide may also be intentionally grown on the semiconductor substrate, although such a grown oxide is not essential to the process in accordance with the invention. In order to epitaxially grow a monocrystalline oxide layer overlying the monocrystalline substrate, the native oxide layer must first be removed to expose the crystalline structure of the underlying substrate. The following process is preferably carried out by molecular beam epitaxy (MBE), although other epitaxial processes may also be used in accordance with the present invention. The native oxide can be removed by first thermally depositing a thin layer of strontium, barium, a combination of strontium and barium, or other alkali earth metals or combinations of alkali earth metals in an MBE apparatus. In the case where strontium is used, the substrate is then heated to a temperature of about 850° C. to cause the strontium to react with the native silicon oxide layer. The strontium serves to reduce the silicon oxide to leave a silicon oxide-free surface. The resultant surface, which exhibits an ordered 2×1 structure, includes strontium, oxygen, and silicon. The ordered 2×1 structure forms a template for the ordered growth of an overlying layer of a monocrystalline oxide. The template provides the necessary chemical and physical properties to nucleate the crystalline growth of an overlying layer.

In accordance with an alternate embodiment of the invention, the native silicon oxide can be converted and the substrate surface can be prepared for the growth of a monocrystalline oxide layer by depositing an alkali earth metal oxide, such as strontium oxide, strontium barium oxide, or barium oxide, onto the substrate surface by MBE at a low temperature and by subsequently heating the structure to a temperature of about 850° C. At this temperature, a solid state reaction takes place between the strontium oxide and the native silicon oxide causing the reduction of the native silicon oxide and leaving an ordered 2×1 structure with strontium, oxygen, and silicon remaining on the substrate surface. Again, this forms a template for the subsequent growth of an ordered monocrystalline oxide layer.

Following the removal of the silicon oxide from the surface of the substrate, in accordance with one embodiment of the invention, the substrate is cooled to a temperature in the range of about 200–800° C. and a layer of strontium titanate is grown on the template layer by molecular beam epitaxy. The MBE process is initiated by opening shutters in the MBE apparatus to expose strontium, titanium and oxygen sources. The ratio of strontium and titanium is approximately 1:1. The partial pressure of oxygen is initially set at a minimum value to grow stochiometric strontium titanate at a growth rate of about 0.3–0.5 nm per minute. After initiating growth of the strontium titanate, the partial pressure of oxygen is increased above the initial minimum value. The overpressure of oxygen causes the growth of an amorphous silicon oxide layer at Y the interface between the underlying substrate and the growing strontium titanate layer. The growth of the silicon oxide layer results from the diffusion of oxygen through the growing strontium titanate layer to the interface where the oxygen reacts with silicon at the surface of the underlying substrate. The strontium titanate grows as an ordered monocrystal with the crystalline orientation rotated by 45° with respect to the ordered 2×1 crystalline structure of the underlying substrate. Strain that otherwise might exist in the strontium titanate layer because of the small mismatch in lattice constant between the silicon substrate and the growing crystal is relieved in the amorphous silicon oxide intermediate layer.

After the strontium titanate layer has been grown to the desired thickness, the monocrystalline strontium titanate is capped by a template layer that is conducive to the subsequent growth of an epitaxial layer of a desired graded layer 32. For example, for the subsequent growth of a monocrystalline silicon germanium layer, the MBE growth of the strontium titanate monocrystalline layer can be capped by terminating the growth with 1–2 monolayers of titanium, 1–2 monolayers of titanium-oxygen or with 1–2 monolayers of strontium-oxygen. Following the formation of this capping layer, silicon cap layer 31 may be formed using MBE growth techniques. Following the formation of the template (and, if desired, cap layer 31) layer 32 is formed by epitaxially growing, for example, a graded layer of silicon germanium.

The structure illustrated in FIG. 2 can be formed by the process discussed above with the addition of an additional monocrystalline layer 26 deposition step. Layer 26 is suitably formed overlying the template or cap layer using methods described above.

Structure 34, illustrated in FIG. 3, may be formed by growing an accommodating buffer layer, forming an amorphous oxide layer over substrate 22, and growing graded layer 32 over the accommodating buffer layer, as described above. The accommodating buffer layer, the amorphous oxide layer, and the cap layer are then exposed to an anneal process sufficient to change the crystalline structure of the accommodating buffer layer from monocrystalline to amorphous, thereby forming an amorphous layer such that the combination of the amorphous oxide layer, the now amorphous accommodating buffer layer, and a portion of cap layer 31 form a single amorphous layer 36. In accordance with one embodiment of the invention, layers 32 and 26 are then subsequently grown over layer 31. Alternatively, the anneal process may be carried out subsequent to growth of layer 32.

In accordance with one aspect of this embodiment, layer 36 is formed by exposing substrate 22, the accommodating buffer layer, the amorphous oxide layer, and cap layer 31 to a rapid thermal anneal process with a peak temperature of about 700° C. to about 1000° C. and a process time of about 5 seconds to about 10 minutes. However, other suitable anneal processes may be employed to convert the accommodating buffer layer to an amorphous layer in accordance with the present invention. For example, laser annealing, electron beam annealing, or "conventional" thermal annealing processes (in the proper environment) may be used to form layer 36. When conventional thermal annealing is employed to form layer 36, an overpressure of one or more constituents of layer 30 and/or 31 may be required to prevent degradation of the layer(s) during the anneal process.

The process described above illustrates a process for forming a semiconductor structure including a silicon substrate, an overlying oxide layer, and a monocrystalline material layer comprising a gallium arsenide compound semiconductor layer by the process of molecular beam epitaxy. The process can also be carried out by the process of chemical vapor deposition (CVD), metal organic chemical vapor deposition (MOCVD), migration enhanced epitaxy (MEE), atomic layer epitaxy (ALE), physical vapor deposition (PVD), chemical solution deposition (CSD), pulsed laser deposition (PLD), or the like. Further, by a similar process, other monocrystalline accommodating buffer layers such as alkaline earth metal titanates, zirconates, hafnates, tantalates, vanadates, ruthenates, and niobates, peroskite oxides such as alkaline earth metal tin-based perovskites, lanthanum aluminate, lanthanum scandium oxide, and gadolinium oxide can also be grown. Further, by a similar process such as MBE, other monocrystalline material layers comprising other III–V and II–VI monocrystalline compound semiconductors, semiconductors, metals and other materials can be deposited overlying the monocrystalline graded layer.

Each of the variations of monocrystalline material layers, monocrystalline graded layers, and monocrystalline accommodating buffer layers uses an appropriate template for initiating the growth of the monocrystalline layer. For example, if the accommodating buffer layer is an alkaline earth metal zirconate, the oxide can be capped by a thin layer of zirconium. The deposition of zirconium can be followed by the deposition of silicon to react with the zirconium as a precursor to depositing silicon germanium. Similarly, if the monocrystalline accommodating buffer layer is an alkaline earth metal hafnate, the oxide layer can be capped by a thin layer of hafnium. The deposition of hafnium is followed by the deposition of silicon. In a similar manner, strontium titanate can be capped with a layer of strontium or strontium and oxygen and barium titanate can be capped with a layer of barium or barium and oxygen. Each of these depositions can be followed by the deposition of silicon to react with the capping material to form a template for the deposition of a monocrystalline material layer comprising graded monocrylstalline materials such as SiGe and SiC.

The formation of a device structure in accordance with another embodiment of the invention is illustrated schematically in cross-section in FIGS. 5A–5D. Like the previously described embodiments referred to in FIGS. 1–3, this embodiment of the invention involves the process of forming a compliant substrate utilizing the epitaxial growth of single crystal layers, such as the formation of accommodating buffer layer 24 previously described with reference to FIGS. 1 and 2 and amorphous layer 36 previously described with reference to FIG. 3, and the formation of a template layer 30. However, the embodiment illustrated in FIGS. 5A–5D utilizes a template that includes a surfactant to facilitate layer-by-layer monocrystalline material growth.

Figure 5A:
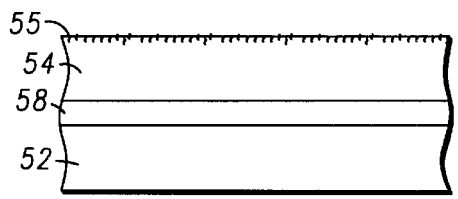
FIGS. 5A–5D illustrate schematically, in cross-section, the formation of a device structure in accordance with another embodiment of the invention.

Turning now to FIG. 5A, an amorphous intermediate layer 58 is grown on substrate 52 at the interface between substrate 52 and a growing accommodating buffer layer 54, which is preferably a monocrystalline crystal oxide layer, by the oxidation of substrate 52 during the growth of layer 54. Layer 54 is preferably a monocrystalline oxide material such as a monocrystalline layer of $Sr_zBa_{1-z}TiO_3$ where z ranges from 0 to 1. However, layer 54 may also comprise any of those compounds previously described with reference layer 24 in FIGS. 1–2 and any of those compounds previously described with reference to layer 36 in FIG. 3, which is formed, at least in part, from layers 24, 28, referenced in FIGS. 1 and 2—layer 36 may also include material from layer 31, illustrated in FIG. 3.

Figure 5B:
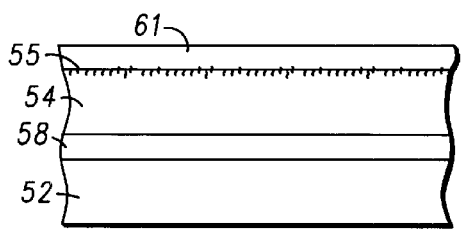
Figure 5C:
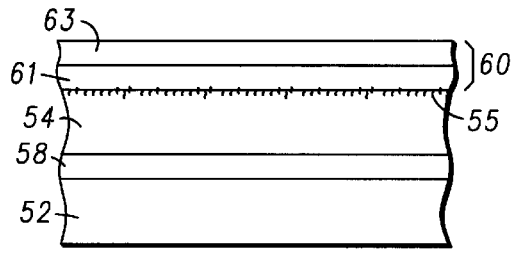
Figure 5D:
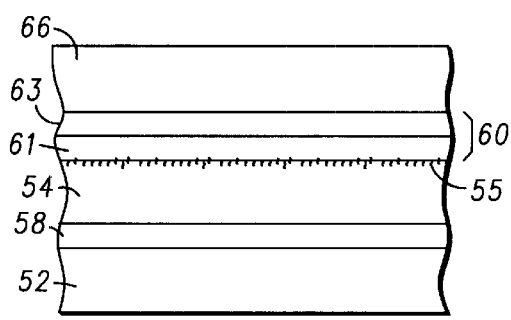

Layer 54 is grown with a strontium terminated surface represented in FIG. 5A by hatched line 55 which is followed by the addition of a template layer 60 which includes a surfactant layer 61 and capping layer 63 as illustrated in FIGS. 5B and 5C.

Surfactant layer 61 may comprise, but is not limited to, elements such as Al, In and Ga, but will be dependent upon the composition of layer 54 and the overlying layer of monocrystalline material (e.g., a graded monocrystalline material layer) for optimal results. In one exemplary embodiment, Al is used for surfactant layer 61 and functions to modify the surface and surface energy of layer 54. Preferably, surfactant layer 61 is epitaxially grown, to a thickness of one to two monolayers, over layer 54 as illustrated in FIG. 5B by way of molecular beam epitaxy (MBE), although other epitaxial processes may also be performed, including chemical vapor deposition (CVD), metal organic chemical vapor deposition (MOCVD), migration enhanced epitaxy (MEE), atomic layer epitaxy (ALE), physical vapor deposition (PVD), chemical solution deposition (CSD), pulsed laser deposition (PLD), and the like.

Surfactant layer 61 is then exposed to a halogen such as arsenic, for example, to form capping layer 63 as illustrated in FIG. 5C. Surfactant layer 61 may be exposed to a number of materials to create capping layer 63 such as elements which include, but are not limited to, As, P, Sb and N. Surfactant layer 61 and capping layer 63 combine to form template layer 60.

Surfactant layer will be exposed to silicon to form a silicon aliminum layer. Then, monocrystalline graded layer 66, which in this example is a semiconductor such as Si or SiGe, is then deposited via MBE, CVD, MOCVD, MEE, ALE, PVD, CSD, PLD, and the like to form the final structure illustrated in FIG. 5D.

FIGS. 6A–6D illustrate possible molecular bond structures for a specific example of a semiconductor structure formed in accordance with the embodiment of the invention illustrated in FIGS. 5A–5D. More specifically, FIGS. 6A–6D illustrate the growth of a monocrystalline film (layer 66) on the strontium terminated surface of a strontium titanate monocrystalline oxide (layer 54) using a surfactant containing template (layer 60).

The growth of a monocrystalline graded layer 66 such as SiGe on an accommodating buffer layer 54 such as a strontium titanium oxide over amorphous interface layer 58 and substrate layer 52, both of which may comprise materials previously described with reference to layers 28 and 22, respectively in FIGS. 1 and 2, illustrates a critical thickness of about 1000 Angstroms where the two-dimensional (2D) and three-dimensional (3D) growth shifts because of the surface energies involved. In order to maintain a true layer-by-layer growth (Frank Vander Mere growth), the following relationship must be satisfied:

$$\delta_{STO} > (\delta_{INT} + \delta_{GradedLayer})$$

where the surface energy of the monocrystalline oxide layer 54 must be greater than the surface energy of the amorphous interface layer 58 added to the surface energy of layer 66. Since it is impracticable to satisfy this equation, a surfactant containing template is used, as described above with reference to FIGS. 5B–5D, to increase the surface energy of the monocrystalline oxide layer 54 and also to shift the crystalline structure of the template to a diamond-like structure that is in compliance with the Si or SiGe layer.

Figure 6A:
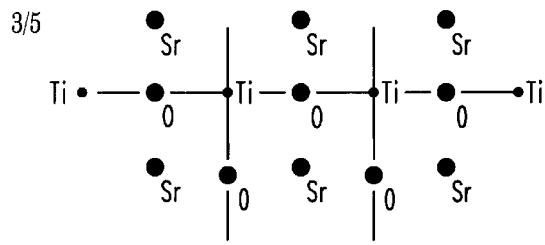
FIGS. 6A–6D illustrate a probable molecular bonding structure of the device structures illustrated in FIGS. 5A–5D.
Figure 6B:
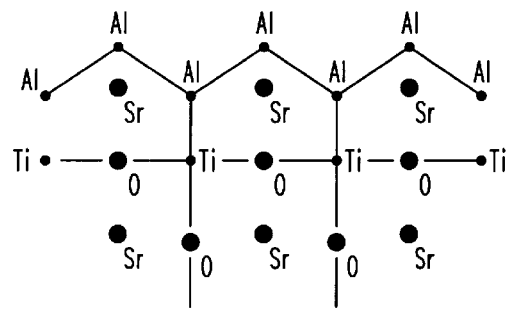
Figure 6C:
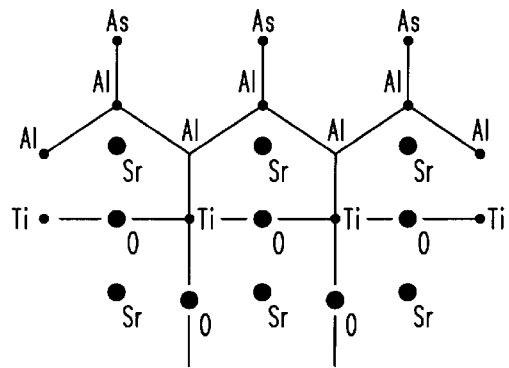
Figure 6D:
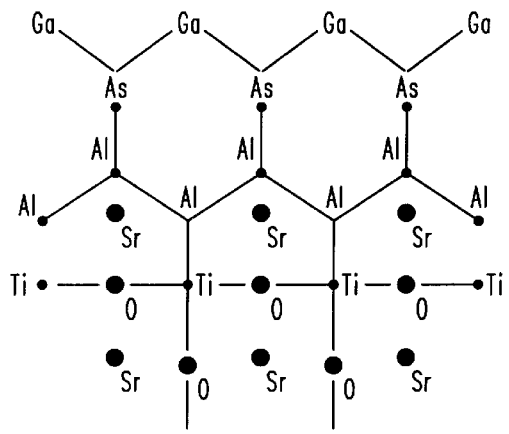
Figure 7:
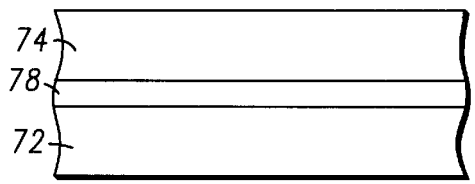
FIGS. 7–10 illustrate schematically, in cross-section, the formation of a device structure in accordance with still another embodiment of the invention.

FIG. 6A illustrates the molecular bond structure of a strontium terminated surface of a strontium titanate monocrystalline oxide layer. An aluminum surfactant layer is deposited on top of the strontium terminated surface and bonds with that surface as illustrated in FIG. 6B, which reacts to form a capping layer comprising a monolayer having the molecular bond structure illustrated in FIG. 6B which forms a diamond-like structure with an $Sp^3$ hybrid terminated surface that is compliant with semiconductors such as Si and SiGe. SiGe is then deposited to complete the molecular bond structure illustrated in FIG. 6D which has been obtained by 2D growth. Alkaline earth metals such as those in Group IIA are those elements preferably used to form the capping surface of the monocrystalline oxide layer 24 because they are capable of forming a desired molecular structure with aluminum.

In this embodiment, a surfactant containing template layer aids in the formation of a compliant substrate for the monolithic integration of various material layers including those comprised of Group IV, Group III–V, and Group II–VI compounds to form high quality semiconductor structures, devices and integrated circuits. For example, a surfactant containing template may be used for the monolithic integration of a monocrystalline material layer such as a layer comprising germanium, for example, to form high efficiency photocells.

Figure 8:
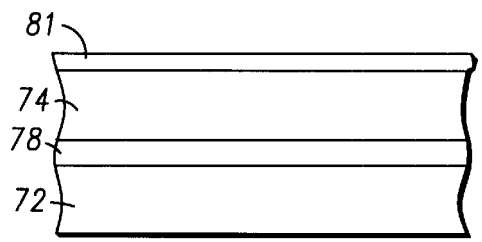
Figure 9:
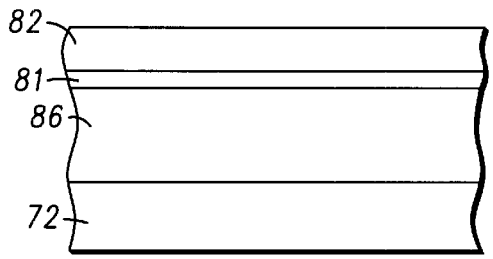
Figure 10:
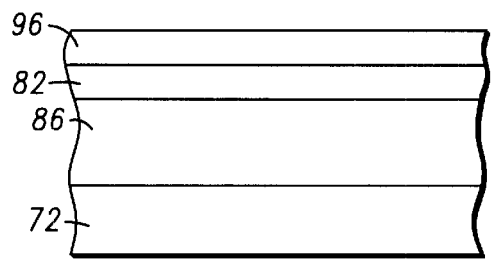

Turning now to FIGS. 8–10, the formation of a device structure in accordance with still another embodiment of the invention is illustrated in cross-section. This embodiment utilizes the formation of a compliant substrate which relies on the epitaxial growth of single crystal oxides on silicon followed by the epitaxial growth of single crystal silicon onto the oxide.

An accommodating buffer layer 74 such as a monocrystalline oxide layer is first grown on a substrate layer 72, such as silicon, with an amorphous interface layer 28 as illustrated in FIG. 8. Monocrystalline oxide layer 74 may be comprised of any of those materials previously discussed with reference to layer 24 in FIGS. 1 and 2, while amorphous interface layer 78 is preferably comprised of any of those materials previously described with reference to the layer 28 illustrated in FIGS. 1 and 2. Substrate 72, although preferably silicon, may also comprise any of those materials previously described with reference to substrate 22 in FIGS. 1–3.

Next, a silicon layer 81 is deposited over monocrystalline oxide layer 74 via MBE, CVD, MOCVD, MEE, ALE, PVD, CSD, PLD, and the like as illustrated in FIG. 9 with a thickness of a few hundred Angstroms but preferably with a thickness of about 50 Angstroms. Monocrystalline oxide layer 74 preferably has a thickness of about 20 to 100 Angstroms.

Rapid thermal annealing is then conducted in the presence of a carbon source such as acetylene or methane, for example at a temperature within a range of about 800° C. to 1000° C. to form capping layer 82 and silicate amorphous layer 86. However, other suitable carbon sources may be used as long as the rapid thermal annealing step functions to amorphize the monocrystalline oxide layer 74 into a silicate amorphous layer 86 and carbonize the top silicon layer 81 to form capping layer 82 which in this example would be a silicon carbide (SiC) layer as illustrated in FIG. 10. The formation of amorphous layer 86 is similar to the formation of layer 36 illustrated in FIG. 3 and may comprise any of those materials described with reference to layer 36 in FIG. 3 but the preferable material will be dependent upon the capping layer 82 used for silicon layer 81.

Finally, a compound semiconductor layer 96, such as gallium nitride (GaN) is grown over the SiC surface by way of MBE, CVD, MOCVD, MEE, ALE, PVD, CSD, PLD, or the like to form a high quality compound semiconductor material for device formation. More specifically, the deposition of GaN and GaN based systems such as GaInN and AlGaN will result in the formation of dislocation nets confined at the silicon/amorphous region. The resulting nitride containing compound semiconductor material may comprise elements from groups III, IV and V of the periodic table and is defect free.

Although GaN has been grown on SiC substrate in the past, this embodiment of the invention possesses a one step formation of the compliant substrate containing a SiC top surface and an amorphous layer on a Si surface. More specifically, this embodiment of the invention uses an intermediate single crystal oxide layer that is amorphosized to form a silicate layer which adsorbs the strain between the layers. Moreover, unlike past use of a SiC substrate, this embodiment of the invention is not limited by wafer size which is usually less than 2 inches in diameter for SiC substrates.

The monolithic integration of nitride containing semiconductor compounds containing group III–V nitrides and silicon devices can be used for high temperature RF applications and optoelectronics. GaN systems have particular use in the photonic industry for the blue/green and UV light sources and detection. High brightness light emitting diodes (LEDs) and lasers may also be formed within the GaN system.

Figure 11:
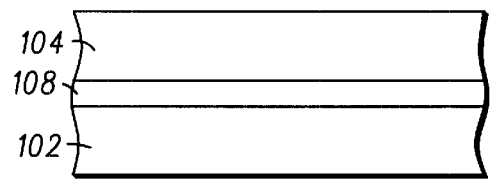
FIGS. 11–14 illustrate schematically, in cross-section, the formation of yet another embodiment of a device structure in accordance with the invention.
Figure 12:
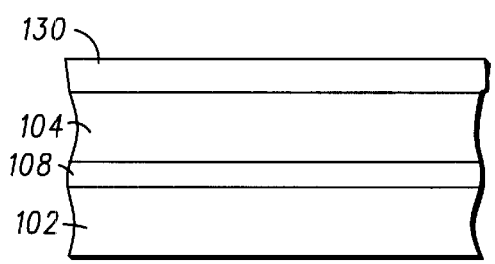
Figure 13:
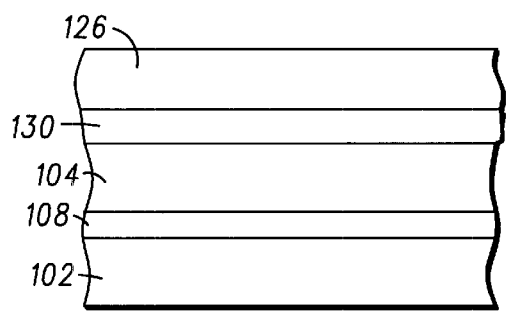

FIGS. 11–13 schematically illustrate, in cross-section, the formation of another embodiment of a device structure in accordance with the invention. This embodiment includes a compliant layer that functions as a transition layer that uses clathrate or Zintl type bonding. More specifically, this embodiment utilizes an intermetallic template layer to reduce the surface energy of the interface between material layers thereby allowing for two dimensional layer by layer growth.

The structure illustrated in FIG. 11 includes a monocrystalline substrate 102, an amorphous interface layer 108 and an accommodating buffer layer 104. Amorphous intermediate layer 108 is grown on substrate 102 at the interface between substrate 102 and accommodating buffer layer 104 as previously described with reference to FIGS. 1 and 2. Amorphous interface layer 108 may comprise any of those materials previously described with reference to amorphous interface layer 28 in FIGS. 1 and 2 but preferably comprises a monocrystalline oxide material such as a monocrystalline layer of $Sr_zBa_{1-z}TiO_3$ where z ranges from 0 to 1. Substrate 102 is preferably silicon but may also comprise any of those materials previously described with reference to substrate 22 in FIGS. 1–3.

A template layer 130 is deposited over accommodating buffer layer 104 as illustrated in FIG. 12 and preferably comprises a thin layer of Zintl type phase material composed of metals and metalloids having a great deal of ionic character. As in previously described embodiments, template layer 130 is deposited by way of MBE, CVD, MOCVD, MEE, ALE, PVD, CSD, PLD, or the like to achieve a thickness of one monolayer. Template layer 130 functions as a "soft" layer with non-directional bonding but high crystallinity which absorbs stress build up between layers having lattice mismatch. Materials for template 130 may include, but are not limited to, materials containing Si, Ga, In, and Sb such as, for example, $AlSr_2$, $(MgCaYb)Ga_2$, $(Ca,Sr,Eu,Yb)In_2$, $BaGe_2As$, and $SrSn_2As_2$.

A monocrystalline graded material layer 126 is epitaxially grown over template layer 130 to achieve the final structure illustrated in FIG. 13. As a specific example, an $SrAl_2$ layer may be used as template layer 130 and an appropriate monocrystalline material layer 126 such as a compound semiconductor material GaAs is grown over the $SrAl_2$. The Al—Ti (from the accommodating buffer layer of layer of $Sr_zBa_{1-z}TiO_3$ where z ranges from 0 to 1) bond is mostly metallic while the Al—As (from the GaAs layer) bond is weakly covalent. The Sr participates in two distinct types of bonding with part of its electric charge going to the oxygen atoms in the lower accommodating buffer layer 104 comprising $Sr_zBa_{1-z}TiO_3$ to participate in ionic bonding and the other part of its valence charge being donated to Al in a way that is typically carried out with Zintl phase materials. The amount of the charge transfer depends on the relative electronegativity of elements comprising the template layer 130 as well as on the interatomic distance. In this example, Al assumes an $sp^3$ hybridization and can readily form bonds with monocrystalline material layer 126, which in this example, comprises compound semiconductor material GaAs.

The compliant substrate produced by use of the Zintl type template layer used in this embodiment can absorb a large strain without a significant energy cost. In the above example, the bond strength of the Al is adjusted by changing the volume of the $SrAl_2$ layer thereby making the device tunable for specific applications which include the monolithic integration of III–V and Si devices and the monolithic integration of high-k dielectric materials for CMOS technology.

Figure 14:
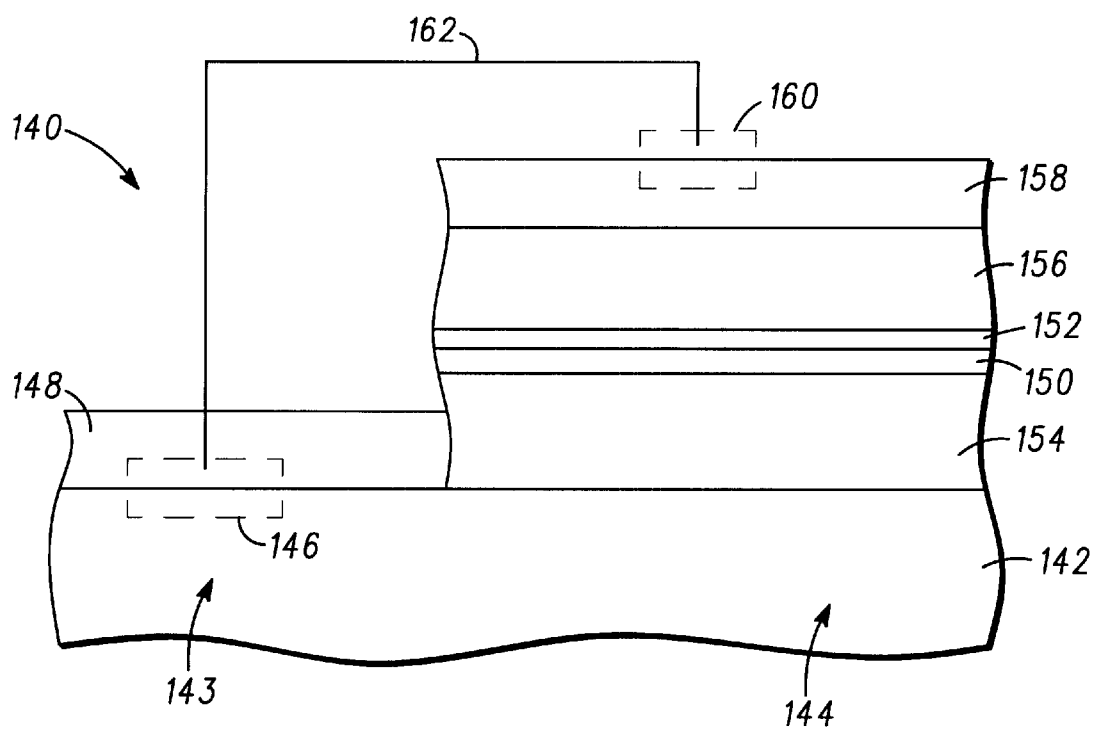

FIG. 14 illustrates schematically, in cross section, a device structure 140 in accordance with a further embodiment of the invention. Device structure 140 includes a monocrystalline semiconductor substrate 142, preferably a monocrystalline silicon wafer. Monocrystalline semiconductor substrate 142 includes two regions, 143 and 144. An electrical semiconductor component generally indicated by the dashed line 146 is formed, at least partially, in region 143. Electrical component 146 can be a resistor, a capacitor, an active semiconductor component such as a diode or a transistor or an integrated circuit such as a CMOS integrated circuit. For example, electrical semiconductor component 146 can be a CMOS integrated circuit configured to perform digital signal processing or another function for which silicon integrated circuits are well suited. The electrical semiconductor component in region 143 can be formed by conventional semiconductor processing as well known and widely practiced in the semiconductor industry. A layer of insulating material 148 such as a layer of silicon dioxide or the like may overlie electrical semiconductor component 146.

Insulating material 148 and any other layers that may have been formed or deposited during the processing of semiconductor component 146 in region 143 are removed from the surface of region 144 to provide a bare silicon surface in that region. As is well known, bare silicon surfaces are highly reactive and a native silicon oxide layer can quickly form on the bare surface. A layer of barium or barium and oxygen is deposited onto the native oxide layer on the surface of region 144 and is reacted with the oxidized surface to form a first template layer (not shown). In accordance with one embodiment of the invention a monocrystalline oxide layer is formed overlying the template layer by a process of molecular beam epitaxy. Reactants including barium, titanium and oxygen are deposited onto the template layer to form the monocrystalline oxide layer. Initially during the deposition the partial pressure of oxygen is kept near the minimum necessary to fully react with the barium and titanium to form the monocrystalline barium titanate layer. The partial pressure of oxygen is then increased to provide an overpressure of oxygen and to allow oxygen to diffuse through the growing monocrystalline oxide layer. The oxygen diffusing through the barium titanate reacts with silicon at the surface of region 144 to form an amorphous layer of silicon oxide on the second region and at the interface between the silicon substrate and the monocrystalline oxide.

In accordance with an embodiment of the invention, the step of depositing the monocrystalline oxide layer is terminated by depositing a layer 150, which can be 1–10 monolayers of titanium, barium, strontium, barium and oxygen, titanium and oxygen, or strontium and oxygen. A cap layer 152 of a monocrystalline semiconductor material is then deposited overlying the second template layer by a process of molecular beam epitaxy.

In accordance with one aspect of the present embodiment, after layer 152 formation, the monocrystalline titanate layer and the silicon oxide layer, which is interposed between substrate 142 and the titanate layer, are exposed to an anneal process such that the titanate and oxide layers form an amorphous oxide layer 154. Graded layer 156 is then epitaxially grown over layer 152, using the techniques described above in connection with layer 32 of FIG. 1. Alternatively, the above described anneal process can be performed before formation of template layer 152.

Next, a layer of monocrystalline material 158, such as GaAs, is formed above graded layer 156. Layer 158 may be formed using any of the material and any of the techniques previously described herein in connection with layer 26.

In accordance with a further embodiment of the invention, a semiconductor component, generally indicated by a dashed line 160 is formed, at least partially, in compound semiconductor layer 158. Semiconductor component 160 can be formed by processing steps conventionally used in the fabrication of gallium arsenide or other III–V compound semiconductor material devices. Semiconductor component 160 can be any active or passive component, and preferably is a semiconductor laser, an electromagnetic radiation (e.g., light—infra red to ultra violet radiation) emitting device, an electromagnetic radiation detector such as a photodetector, a heterojunction bipolar transistor (HBT), a high frequency MESFET, or another component that utilizes and takes advantage of the physical properties of compound semiconductor materials. A metallic conductor schematically indicated by the line 162 can be formed to electrically couple device 146 and device 160, thus implementing an integrated device that includes at least one component formed in the silicon substrate and one device formed in the monocrystalline material layer. Although illustrative structure 140 has been described as a structure formed on a silicon substrate 142 and having a barium (or strontium) titanate layer and a gallium arsenide layer 158, similar devices can be fabricated using other monocrystalline substrates, oxide layers and other monocrystalline material layers as described elsewhere in this disclosure.

Clearly, those embodiments specifically describing structures having compound semiconductor portions and Group IV semiconductor portions, are meant to illustrate embodiments of the present invention and not limit the present invention. There are a multiplicity of other combinations and other embodiments of the present invention. For example, the present invention includes structures and methods for fabricating material layers which form semiconductor structures, devices and integrated circuits including other layers such as metal and non-metal layers. More specifically, the invention includes structures and methods for forming a compliant substrate which is used in the fabrication of semiconductor structures, devices and integrated circuits and the material layers suitable for fabricating those structures, devices, and integrated circuits. By using embodiments of the present invention, it is now simpler to integrate devices that include monocrystalline layers comprising semiconductor and compound semiconductor materials as well as other material layers that are used to form those devices with other components that work better or are easily and/or inexpensively formed within semiconductor or compound semiconductor materials. This allows a device to be shrunk, the manufacturing costs to decrease, and yield and reliability to increase.

In accordance with one embodiment of this invention, a monocrystalline semiconductor or compound semiconductor wafer can be used in forming monocrystalline material layers over the wafer. In this manner, the wafer is essentially a "handle" wafer used during the fabrication of semiconductor electrical components within a monocrystalline layer overlying the wafer. Therefore, electrical components can be formed within semiconductor materials over a wafer of at least approximately 200 millimeters in diameter and possibly at least approximately 300 millimeters.

By the use of this type of substrate, a relatively inexpensive "handle" wafer overcomes the fragile nature of compound semiconductor or other monocrystalline material wafers by placing them over a relatively more durable and easy to fabricate base material. Therefore, an integrated circuit can be formed such that all electrical components, and particularly all active electronic devices, can be formed within or using the monocrystalline material layer even though the substrate itself may include a monocrystalline semiconductor material. Fabrication costs for compound semiconductor devices and other devices employing non-silicon monocrystalline materials should decrease because larger substrates can be processed more economically and more readily compared to the relatively smaller and more fragile substrates (e.g. conventional compound semiconductor wafers).

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any elements) that may cause any benefit, advantage, or solution to occur or become more pronounced are not to be construed as a critical, required, or essential features or elements of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

We claim:

1. A process for fabricating a semiconductor structure comprising:

providing a monocrystalline substrate; epitaxially growing a monocrystalline accommodating buffer layer overlying the monocrystalline semiconductor substrate;

forming an amorphous layer between the monocrystalline substrate and the accommodating buffer layer; and epitaxially growing a graded monocrystalline layer overlying the accommodating buffer layer, wherein said process further comprises heating the monocrystalline accommodating buffer layer and the amorphous layer to cause the monocrystalline accommodating buffer layer to become amorphous.

2. The process of claim 1, wherein the heating includes rapid thermal annealing.

3. The process of claim 2, further comprising forming a first template on the monocrystalline accommodating buffer layer.

4. The process of claim 3, further comprising forming a cap layer over the template.

5. The process of claim 1, further comprising forming a template overlying the monocrystalline substrate.

6. The process of claim 1, wherein epitaxially growing a graded monocrystalline layer includes growing a film comprising SiGe.

7. The process of claim 1, further comprising epitaxially growing a monocrystalline material layer overlying the graded monocrystalline layer.

* * * * *